United States Patent [19]

Prabhu et al.

[11] 4,399,320

[45] Aug. 16, 1983

[54] CONDUCTOR INKS

[75] Inventors: Ashok N. Prabhu, Plainsboro; Kenneth W. Hang, Princeton Junction, both of N.J.

[73] Assignee: RCA Corporation, New York, N.Y.

[21] Appl. No.: 396,662

[22] Filed: Jul. 9, 1982

Related U.S. Application Data

[62] Division of Ser. No. 280,917, Jul. 6, 1981, Pat. No. 4,376,725.

[30] Foreign Application Priority Data

Oct. 17, 1980 [GB] United Kingdom ................. 8033564

[51] Int. Cl.$^3$ .............................................. H05K 1/09
[52] U.S. Cl. ................................... 174/68.5; 361/305; 361/411
[58] Field of Search ................ 174/68.5; 361/305, 411

[56] References Cited

U.S. PATENT DOCUMENTS

| | | | |
|---|---|---|---|
| 3,374,110 | 3/1968 | Miller | 174/68.5 |
| 3,857,798 | 12/1974 | Wall et al. | 174/68.5 X |
| 3,902,102 | 8/1975 | Burn | 361/305 |
| 4,313,026 | 1/1982 | Yamada et al. | 174/68.5 |

*Primary Examiner*—R. R. Kucia
*Attorney, Agent, or Firm*—Brigit E. Morris; R. Hain Swope

[57] ABSTRACT

Improved conductor inks useful in constructing multilayer circuits, particularly on porcelain-coated metal substrates, are provided. The subject inks comprise: copper powder, a barium calcium borosilicate glass frit, a suitable organic vehicle and bismuth oxide, which is present either in admixture with the copper powder or as a component of the glass frit.

5 Claims, No Drawings

CONDUCTOR INKS

This is a division of application Ser. No. 280,917, filed July 6, 1981 now U.S. Pat. No. 4,376,725.

This invention relates to thick-film conductor inks and their use in multilayer electrical circuit structures on porcelain-coated metal boards.

BACKGROUND OF THE INVENTION

The use of specialized ink formulations to form thick films having various functions on suitable substrates in the construction of multilayer structures is well known in the art. Such technology is of increasing interest in the fabrication of very dense multilayer integrated circuit patterns on various substrates for a wide variety of applications in the electronics industry.

Significantly improved substrates for the fabrication of such circuits are disclosed and claimed in Hang et al., U.S. Pat. No. 4,256,796, issued Mar. 17, 1981, the disclosure of which is incorporated herein by reference. The Hang et al. substrates are metal coated with an improved porcelain composition comprised of a mixture, based on its oxide content, of magnesium oxide (MgO) or mixtures of magnesium oxide and certain other oxides, barium oxide (BaO), boron trioxide ($B_2O_3$) and silicon dioxide ($SiO_2$).

While the procelain-coated metal substrates of Hang et al. represent a significant improvement over previously known substrate materials, they are disadvantageous only in being incompatible or poorly compatible with commercially available thick-film inks. This invention is concerned with improved copper conductor inks compatible with the Hang et al. substrates.

It is generally recognized that it is advantageous to include bismuth oxide in copper conductor inks to improve the solderability of films formed therefrom. Conventionally, such inks contain from about 5 percent up to as much as 10 percent by weight bismuth oxide. We have found that bismuth oxide in amounts in excess of about 3 percent by weight of the ink formulation will frequently cause a reaction at the point of contact between a conductor film and a resistor. This results in a significantly increased resistance at the point of contact, a distinct disadvantage.

In accordance with this invention, copper conductor inks are provided which are compatible with the Hang et al. substrates, and are characterized by good solderability without the aforementioned point of contact reaction with resistors.

SUMMARY OF THE INVENTION

The improved conductor inks of this invention comprise a barium calcium borosilicate glass, copper powder, bismuth trioxide and a suitable organic vehicle.

DETAILED DESCRIPTION OF THE INVENTION

In accordance with this invention, there are provided improved copper conductor inks of high reliability useful in the production of complex single or multilayer thick-film circuits on suitable substrates, particularly the procelain-coated metal circuit boards of Hang et al.

In addition to being compatible with the procelain of the Hang et al. substrates, the improved copper conductor inks of this invention are compatible with inks of other functions specifically formulated therefor. The subject copper conductor inks and other functional and protective inks formulated for the Hang et al. porcelain-coated metal boards, together with the boards themselves, represent a significant advance in multilayer thick-film integrated circuit structures.

The novel copper conductor inks of this invention are comprised of copper powder, a glass frit, bismuth oxide and a suitable organic vehicle.

The glass frit of the conductor inks of this invention is a barium calcium borosilicate glass which is compatible with the porcelain of the Hang et al. boards. As a result, thick-film conductors prepared from the subject inks have excellent reheat stability and thermal expansion properties similar to the Hang et al. substrate boards. In addition, by controlling the amount of bismuth oxide included in the inks of this invention, conductor thick-films formed from the inks of this invention are not characterized by the aforementioned reaction at point of contact with resistors, yet possess the solderability conventionally associated with larger amounts of bismuth oxide.

The glass frit of the novel inks of this invention is a barium calcium borosilicate glass consisting of, on a weight basis:

(a) from about 40 to about 55 percent, preferably about 52 percent, of barium oxide;

(b) from about 10 to about 15 percent, preferably about 12 percent, of calcium oxide;

(c) from about 14 to about 25 percent, preferably about 16 percent, of boron trioxide; and (d) from about 13 to about 23 percent, preferably about 20 percent, of silicon dioxide. The glass frit comprises from about 1 to about 15 percent, preferably from about 2 to about 6 percent by weight, of the total ink composition.

The copper powder utilized in the conductive inks of this invention is pure copper having a particle size of about 3.0 to 3.2 micrometers. The copper comprises from about 70 to about 90 percent, preferably from about 78 to about 82 percent by weight, of the subject ink compositions.

The conductor inks of this invention contain from about 0.5 to about 3.0 percent, preferably from about 1 to about 2 percent by weight, of bismuth oxide. It is critical that the bismuth oxide content does not exceed about 3 percent by weight of the total ink composition. It is also necessary that the subject inks contain no lead oxide since its presence will cause the same termination reactions, even where the bismuth oxide content is well below the 3 weight percent maximum. The bismuth oxide and the glass frit are preferably present in the subject inks in a weight ratio of from about 1:1 to about 1:3. The bismuth oxide may be added to the subject inks as a powder of may be present in the glass frit itself.

The organic vehicles are binders such as, for example, cellulose derivatives, particularly ethyl cellulose, synthetic resins such as polyacrylates or methacrylates, polyesters, polyolefins and the like. In general, conventional vehicles utilized in inks of the type described herein may be used in the subject inks. Preferred commercially available vehicles include, for example, pure liquid polybutenes available as Amoco H-25, Amoco H-50 and Amoco L-100 from Amoco Chemicals Corporation, poly n-butylmethacrylate available from E. I. duPont de Nemours and Co., and the like.

The above resins may be utilized individually or in any combination of two or more. A suitable viscosity modifier can be added to the resin material if desired. These modifiers can be solvents such as those conventionally used in similar ink compositions, e.g. pine oil, terpineol, butyl carbitol acetate, an ester alcohol available from Texas Eastman Company under the trademark Texanol and the like, or solid materials such as, for example, a castor oil derivative available from N.L. Industries under the trademark Thixatrol.

The vehicle of the subject inks may also contain up to about 25 percent by weight, preferably from about 10 to about 20 percent by weight, based on the vehicle, of a suitable wetting agent of the type conventionally used in copper conductor inks to aid in coating the particles of copper powder with the organic vehicle. As is the case with all components of the organic vehicle, the wetting agent must fire cleanly in nitrogen, i.e., without leaving a carbonaceous residue. A preferred wetting agent is a dispersion of a complex multifunctional, aliphatic hydrocarbon in an aliphatic hydrocarbon oil available under the trademark Hypothiolate 100 from Central Compounding Company, Chicago, Illinois. The organic vehicle comprises from about 6 to about 25 percent by weight, preferably from about 12 to about 15 percent by weight, of the subject inks.

The improved copper conductor inks of this invention are applied to the substrate, e.g., conventional alumina boards or the improved procelain-coated metal boards of Hang et al. by conventional means, i.e. screen printing, brushing, spraying and the like, with screen printing being preferred. The coating of ink is then dried in air at 100°-125° C. for about 15 minutes. The resulting film is then fired in nitrogen at peak temperatures of from 850° to 950° C. for from 4 to 10 minutes.

Films formed from the novel conductor inks of this invention have been demonstrated to be comparable with conventional copper conductor inks in all properties including solderability and to be clearly superior in compatibility with the Hang et al. porcelain-coated metal substrate boards. Films formed from the novel copper conductor inks of this invention demonstrate compatibility both with films formed from conventional thick-film tin oxide or indium oxide resistor inks and resistor inks formulated to be compatible with the Hang et al. procelain-coated metal boards. The films likewise demonstrate good conductivity, solderability, solder leach resistance, wire bondability and resistance to long term exposure to high humidity.

The following Examples further illustrate this invention, it being understood that the invention is in no way intended to be limited to the details described therein. In the Examples, all parts and percentages are on a weight basis and all temperatures are in degrees Celsius unless otherwise stated.

EXAMPLE 1

Copper conductor inks were prepared from the following formulations:

| Ingredient | Percent by Weight | | | | |
| --- | --- | --- | --- | --- | --- |
| | A | B | C | D | E |
| Copper Powder | 81.08 | 81.08 | 81.08 | 79.37 | 81.08 |
| Glass Frit* | 3.24 | 2.16 | 1.08 | 2.11 | — |
| $Bi_2O_3$ | 1.08 | 2.16 | 3.24 | 4.23 | 2.16 |
| Commercial** Pb/B/Si Glass | — | — | — | — | 2.16 |

-continued

| Ingredient | Percent by Weight | | | | |
| --- | --- | --- | --- | --- | --- |
| | A | B | C | D | E |
| Vehicle*** | 14.60 | 14.60 | 14.60 | 14.29 | 14.60 |

*The glass frit had the following composition: BaO 51.32 percent; CaO 12.51 percent; $B_2O_3$ 19.42 percent; and $SiO_2$ 16.75 percent.
**Exact formulation not available. Estimated lead oxide content 60 percent.
***On a weight basis: 62.96 percent of a 6 percent solution of ethyl cellulose in the ester alcohol Texanol available from Texas Eastman Company; 18.52 percent Hypothiolate 100 wetting agent available from Central Compounding Company, Chicago, Ill. (dispersion of hydroxyl containing, multifunctional aliphatic hydrocarbon in aliphatic hydrocarbon oil) and 18.52 percent of an 11.2 percent dispersion of the castor oil derivative Thixatrol, available from N.L. Industries, in Texanol.

The powder ingredients were combined with the organic vehicle, initially mixed by hand and then on a 3 roll mill with shearing to obtain a smooth paste suitable for screen printing. Additional vehicle was added to replace loss during mixing and to assure proper rheology. Conductor terminations were printed with the thus formed inks on a porcelain coated steel board of the type disclosed by Hang et al. using a stainless steel screen (200 mesh, 1 mil emulsion). The terminations were dried in air at 125° for 15 minutes and then fired in nitrogen in a belt furnace at peak temperature of 850°±10° for 8-12 minutes. Indium oxide resistor inks were then printed, dried in a similar manner and fired in nitrogen at 900°±5° for 4-7 minutes at peak temperature. The resistor widths varied from 50 to 100 mils. The resistor inks utilized were prepared from the following formulations:

| Ingredient | Percent by Weight | |
| --- | --- | --- |
| | A | B |
| Indium Oxide | 46.51 | 34.09 |
| Glass I | 27.91 | — |
| Glass II | — | 38.64 |
| Magnesium Oxide | — | 4.55 |
| Ethyl Cellulose, 6 percent, Solution in Texanol | 25.58 | 22.72 |

The glass frits utilized in the above resistor ink formulations had the following composition.

| Ingredient | Percent by Weight | |
| --- | --- | --- |
| | I | II |
| Barium Oxide | 50.32 | 51.59 |
| Calcium Oxide | 12.28 | 12.58 |
| Boron Trioxide | 19.05 | 15.62 |
| Silicon Dioxide | 16.43 | 20.21 |
| Cobalt Oxide | 1.92 | — |
| Average Particle Size | 3.4 μm | 4.3-4.5 μm |

The sheet resistance of each of the five copper conductor films was determined for each of the two resistors. The results are reported in Table 1.

TABLE I

| Conductor Formulation | Sheet Resistance KΩ/□ | |
| --- | --- | --- |
| | I | II |
| A | 9.8 | 202.3 |
| B | 11.3 | 297.3 |
| C | 16.3 | 516.7 |
| D | 19.5 | 882.3 |
| E | 28.9 | 460.0 |

The data for formulations C and D demonstrate that, when the bismuth oxide content of the inks exceeds 3 percent, the sheet resistance begins to rise sharply. Formulation E shows that, even if the bismuth oxide content of the copper ink is less than 3 weight percent, the presence of lead oxide in the glass causes an undesirable terminal point reaction.

EXAMPLE 2

A copper ink was prepared according to the procedure of Example 1 from the formulation designated "B". In this example, however, the bismuth oxide powder was added to the oxides melted to make the glass frit as opposed to being added to the ink as a separate ingredient. Terminations were printed and fired on a conventional alumina board and two porcelain-coated steel boards of the type disclosed by Hang et al. The porcelains of the Hang et al., type boards had the following composition:

| Ingredient | Weight Percent in Porcelain | |
|---|---|---|
| | A | B |
| Magnesium Oxide | 40.98 | 27.96 |
| Barium Oxide | 18.82 | 37.34 |
| Boron Trioxide | 24.41 | 16.96 |
| Silicon Dioxide | 15.79 | 17.74 |

Two commercial stannic oxide containing resistor inks available from TRW, Inc. Philadelphia, Pa. were printed and fired on the substrates in the manner of Example 1. The sheet resistivities are reported in Table II.

TABLE II

| Resistor Ink | Sheet Resistance KΩ/□ | | |
|---|---|---|---|
| | Alumina | Porcelain A | Porcelain B |
| TS104 | 30.8 | 51.9 | 341 |
| TS105 | 119.8 | 142.9 | 1157 |

The high resistance readings for porcelain B are the result of the migration of iron into the porcelain which in turn reduces the stannic oxide in the commercial inks. The change in resistivity is due to the substrate and not the copper inks. The data in Table II further demonstrates the compatibility of the copper conductor inks of this invention with various substrates as well as with films formed from commercial resistor inks.

We claim:

1. A circuit board having on a portion of the surface thereof a coating of a conductor ink comprising:
   (a) from about 70 to about 90 percent by weight of copper powder;
   (b) from about 1 to about 15 percent by weight of a barium calcium borosilicate glass frit;
   (c) from about 0.5 to about 3 percent by weight of bismuth oxide, wherein bismuth oxide is present in admixture with the copper powder or as a component of the glass frit; and
   (d) from about 6 to about 25 percent by weight of a suitable organic vehicle.

2. A circuit board in accordance with claim 1, wherein said board is porcelain-coated metal.

3. A process for forming a conductor film as part of a circuit on a suitable circuit board comprising applying and firing onto said board an ink composition comprising:
   (a) from about 70 to about 90 percent by weight of copper powder;
   (b) from about 1 to about 15 percent by weight of a barium calcium borosilicate glass frit;
   (c) from about 0.5 to about 3 percent by weight of bismuth oxide, wherein bismuth oxide is present in admixture with the copper powder or as a component of the glass frit; and
   (d) from about 6 to about 25 percent by weight of a suitable organic vehicle.

4. An electronic assembly comprising a circuit board having a circuit thereon, said circuit containing a conductor film formed by applying and firing a conductor ink comprising:
   (a) from about 70 to about 90 percent by weight of copper powder;
   (b) from about 1 to about 15 percent by weight of a barium calcium borosilicate glass frit;
   (c) from about 0.5 to about 3 percent by weight of bismuth oxide, wherein bismuth oxide is present in admixture with the copper powder or as a component of the glass frit; and
   (d) from about 6 to about 25 percent by weight of a suitable organic vehicle.

5. An electronic assembly in accordance with claim 4, wherein said circuit board is a procelain-coated metal circuit board.

* * * * *